VARIABLE GAIN AMPLIFIER AND CIRCUITS USING SAME

Filed May 13, 1966 5 Sheets-Sheet 1

Inventor
JEAN V. MARTENS
By [signature]
Attorney

Dec. 2, 1969 J. V. MARTENS 3,482,180

VARIABLE GAIN AMPLIFIER AND CIRCUITS USING SAME

Filed May 13, 1966 5 Sheets-Sheet 2

Inventor
JEAN V. MARTENS
By [signature]
Attorney

Dec. 2, 1969 J. V. MARTENS 3,482,180

VARIABLE GAIN AMPLIFIER AND CIRCUITS USING SAME

Filed May 13, 1966 5 Sheets-Sheet 3

Inventor
JEAN V. MARTENS

By Percy P. Lantzy
Attorney

Inventor
JEAN V. MARTENS
By [signature]
Attorney

VARIABLE GAIN AMPLIFIER AND CIRCUITS USING SAME

Filed May 13, 1966 5 Sheets-Sheet 5

Inventor
JEAN V. MARTENS
By
Attorney

United States Patent Office 3,482,180

Patented Dec. 2, 1969

3,482,180
VARIABLE GAIN AMPLIFIER AND CIRCUITS USING SAME

Jean Victor Martens, Deurne, Belgium, assignor to International Standard Electric Corporation, New York, N.Y., a corporation of Delaware Filed May 13, 1966, Ser. No. 550,010
Claims priority, application Netherlands, June 24, 1965, 6508145
Int. Cl. H03f *1/14*
U.S. Cl. 330—51 10 Claims

ABSTRACT OF THE DISCLOSURE

A variable gain amplifier comprising two differential amplifiers coupled in parallel fed by a constant current generator through associated gating transistors. Control signals are coupled to the gating transistors to adjust the gain of the amplifier by controlling the number of differential amplifiers receiving the constant current and, hence, the number of active differential amplifiers. This arrangement provides almost perfect decoupling between the control and transmission path and temperature compensation due to circuit symmetry.

The present invention relates to a variable gain amplifier and to circuits using same.

One possible application of variable gain amplifiers is in companded analog digital converters as disclosed for instance in the U.S. Patent 3,067,291.

In such variable gain amplifiers use is made of diodes to perform the variation of the gain. It is well known that the diode characteristics are sensitive to temperature variations and diode ageing. Hence, there results an inaccuracy of the input-output characteristic of the amplifier, which is composed of straight line segments, and especially an uncertainty as to the exact location of the knee points of gain variation of this input-output characteristic. For very small input signals, e.g., of the order of a few millivolts, the relative error becomes important and when these variable gain amplifiers are used as compandors in PCM (pulse code modulation) transmission systems, there results a coding uncertainty since the value of a coding or decoding step is also of the same order, i.e., a few millivolts. Moreover for such PCM transmission systems the expander characteristic could not exactly compensate the compression characteristic due principally to the uncertainty as to the exact location of the above mentioned knee points of gain variation on the compressor and expander characteristics.

Non-linear analog/digital converters which have a piecewise linear characteristic obtained from different coding step sizes of these converters are also known in the art, e.g., from the U.S. Patent 3,016,528. However, the main drawback of these converters resides in the difficulties encountered in the accurate production of the smallest coding steps, so that the present tendency is to abandon this type of converters in favor of the companded converters.

An object of the present invention is to provide a variable gain amplifier which does not present the above mentioned drawbacks.

The present variable gain amplifier is characterized by the fact that, it includes at least a first and a second amplifying section having a common output impedance and being fed by constant-current generator means, switching means controlled by control means being adapted to electrically disconnect said constant current generator means from one or more selected sections, whereby a substantially perfect decoupling between control and useful signal path is performed.

Another object of the present invention is to provide an improved companded analog/digital converter system.

In accordance with another characteristic of the invention, a companded analog/digital converter system is characterized by the fact that it includes a variable gain amplifier of the type defined above, associated with a linear analog/digital converter, and that the digital side of said converter controls said switching means.

Another possible application of variable gain amplifiers is as phase-inverter modulators particularly those of the double balanced type. Double balanced transistorized phase-inverter modulators are in themselves known. The U.S. Patent 3,124,467, for instance, shows such a modulator, but transformers are required in addition to the transistors. Even in the U.S. Patent Nos. 2,994,044 and 3,010,079 it would not be possible in practice to avoid transformers, since the circuits would not allow both the signal and the carrier sources to have one of their terminals at a fixed reference potential without creating unbalance conditions. Moreover transistors of opposite conductivity type are required.

Another object of the invention is to realize a novel double balanced transistorized modulator which avoids such drawbacks, i.e., which does not necessarily require transformers, transistors of opposite conductivity type and which may be driven by signal and carrier sources which can both be unbalanced with respect to ground.

According to still another aspect of the invention, a phase-inverter modulator is characterized by the fact, that it comprises a variable gain amplifier of the type previously defined, with said amplifying sections exhibiting linear input-output relationships with slopes of opposite signs.

A further object of the present invention is to provide an improved companded digital-to-analog converter system.

In accordance with a further aspect of the invention, a companded digital-to-analog converter system is characterized by the fact that it includes a phase-inverter modulator of the type defined above, and that said phase-inverter modulator is coupled in series with a digital-to-analog converter which produces analog signals of one polarity only, the setting of said phase-inverter modulator in its positive or negative gain condition depending on the nature of the highest weight binary digit of the digital signal version.

The present invention also relates to a sequential comparison analog-to-digital converter system, including comparison means to compare an analog input signal with a number of successive reference signals for accordingly producing the binary digits of the digital signal version.

Such a sequential comparison analog-to-digital converter system is known from the article "A Companded Coder for an Experimental PCM Terminal" by H. Mann et al., published in the Bell System Technical Journal, January 1962. The above known system, however, requires a number of reference signals equal to the number of digits of the digital signal version and in addition a DC bias which is added to the analog signal before starting the sequential comparisons. Moreover, the switching process for the production of the successive reference signals is complicated; for instance, it may happen that during the successive comparisons of an analog signal with the reference signals, a reference signal has to be disconnected before the application of the next one.

Another object of the present invention is to provide a sequential comparison analog-to-digital converter system which does not present the above drawbacks.

The present sequential comparison analog-to-digital converter system is characterized by the fact, that said comparison means include a discriminator circuit which is constituted by a differential amplifier having a first and a second input, the input analog signals being applied to both said first and said second input in push-pull, and that said reference signals, which are of one polarity only, are applied to said first or to said second input depending on the nature of the preceding binary digit(s) of the digital signal version.

The above mentioned and other objects and features of the invention will become more apparent and the invention itself will be best understood by referring to the following description of embodiments taken in conjunction with the accompanying drawings in which.

Figure 8:
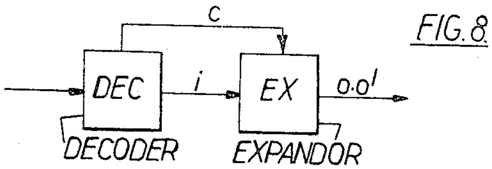
Figure 9:
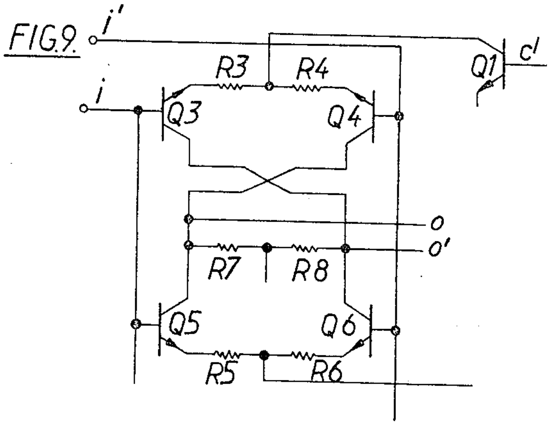
Figure 10:
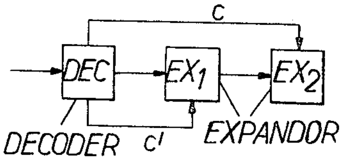

FIG. 8 diagrammatically represents an embodiment of an expander circuit according to the invention and included in the above PCM transmission system;

FIG. 9 shows part of a phase-inverter modulator according to the invention;

FIG. 10 diagrammatically represents a further embodiment of an expander circuit according to the invention which includes the circuits of FIGS. 8 and 9.

Figure 1:
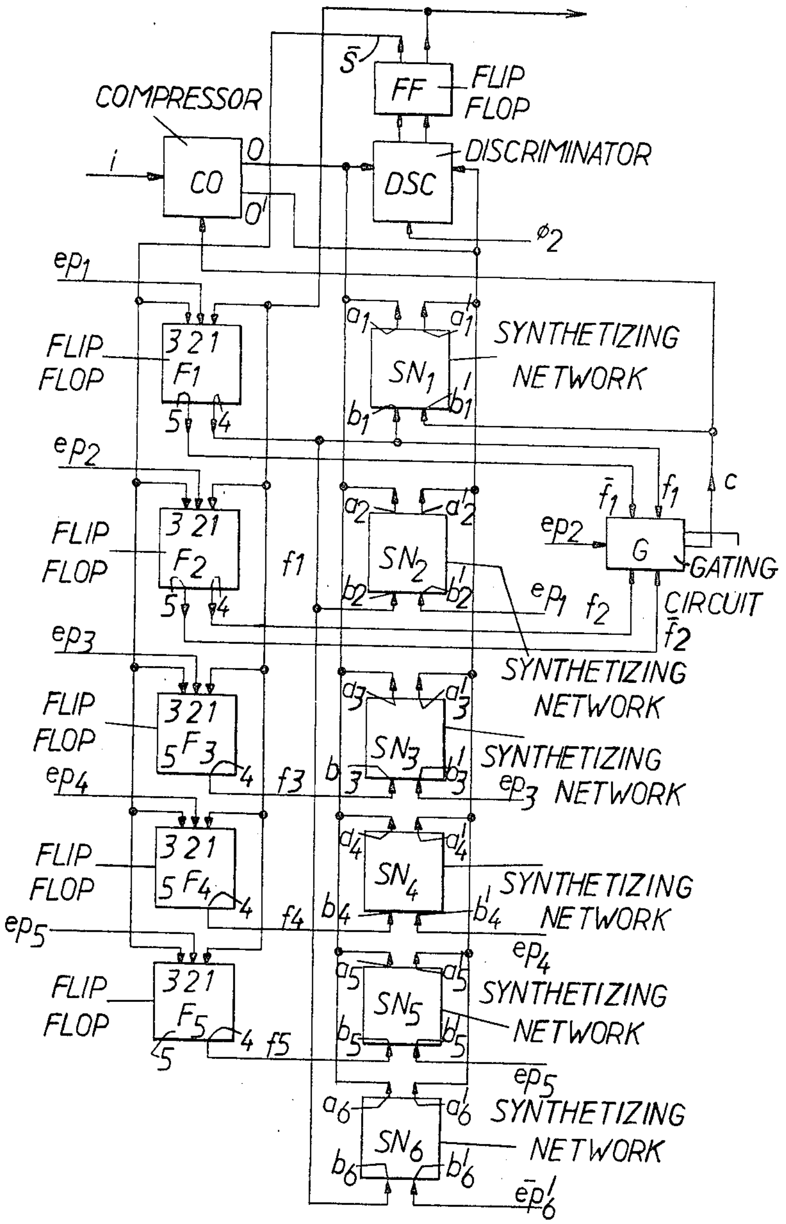
FIG. 1 represents a companded coder according to the invention and included in a PCM transmission system.

Referring to FIG. 1, the companded coder shown therein is constituted by a compressor circuit C0 followed by a linear encoder which is a digit-at-a-time, or sequential comparison encoder. The compressor circuit C0 has an input $i$ at which the PAM signals to be compressed are applied and two outputs 0, 0′ through which the compressed PAM signals are supplied to the encoder. The encoder comprises three functional parts: the decision part, the control part and the weighing part. It is assumed that the above encoder comprises 64 quantum steps, i.e., it converts an analog input signal into a 6-digit PCM output signal.

The decision part of the encoder comprises a discriminator DSC and an output flip-flop FF. The discriminator DSC has two inputs 0, 0′ correspondingly connected to the homologue outputs 0, 0′ of the compressor C0 and two outputs connected to the two respective inputs of a flip-flop FF. Another input $\emptyset_2$ of the discriminator DSC is connected to an output $\emptyset_2$ of a source of clock pulses (not shown). The outputs of the flip-flop FF is coupled to the transmission line (not shown).

Figure 6:
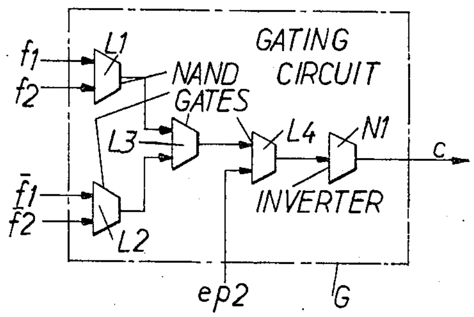
FIGS. 6 and 7 show in more detail some block circuits of FIG. 1.
Figure 7:
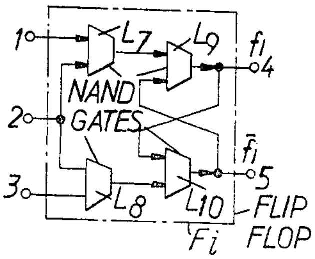

The control part comprises five gated-input flip-flops $F_1$ to $F_5$ each having three inputs numbered 1, 2, 3 and two outputs numbered 4, 5 and a gating circuit G. The gated-input flip-flops $F_1$ to $F_5$ are well known in the art, e.g., they are Fairchild Micrologic Half Shift Register elements $\mu$L906, and FIG. 7 schematically represents the block circuitry of such an element $F_i$ ($i$=1 to 5). The element $F_i$ is constituted by four 2-input NAND (Not AND) gates $L_7$ and $L_{10}$, which are Resistor Transistor Logic, gate circuits, the gates $L_9$ and $L_{10}$ constituting the output flip-flop stage and the gates $L_7$, $L_8$ the input gating stage. The inputs 1 and 3 of the element $F_i$ constitute one input of the gates $L_7$ and $L_8$, respectively, whereas the input 2 of the element $F_i$ constitutes the second common input of both these gates $L_7$, $L_8$. The outputs 4 and 5 of the element $F_i$ are the outputs of the gates $L_9$ and $L_{10}$, respectively and constitute the $f_i$ (1 or 0) and $\bar{f}_i$ (0 or 1) complementary outputs of the flip-flop stage $L_9$, $L_{10}$, or of the whole gated-input flip-flop $F_i$. The inputs 1 of the gated-input flip-flops $F_1$ to $F_5$ (FIG. 1) are connected in parallel to each other and their parallel connection is connected to the outputs of the flip-flop FF. In a similar way the inputs 3 of the gated-input flip-flops $F_1$ to $F_5$ are paralleled and their parallel connection is connected to the output $\bar{s}$ of the flip-flop FF. The inputs 2 of the gated-input flip-flops $F_1$ to $F_5$ are connected to corresponding outputs $ep_1$ to $ep_5$ of a timing source (not shown). The gating circuit G has, on the one hand, five inputs correspondingly connected to the outputs $f_1$, $\bar{f}_1$ and $f_2$, $\bar{f}_2$ of the gated-input flip-flops $F_1$ and $F_2$, and to the output $ep_2$ of the above mentioned timing source, and, on the other hand, one output $c$ which is connected to a homologue control input of the compressor C0. The circuitry of the gating circuit G is schematically shown in FIG. 6. This circuit G is constituted by four 2-input NAND gates $L_1$ to $L_4$ and one inverter $N_1$, which are RTL circuits well known in the art and forms at its output $c$ the logical function $$c=ep_2(f_1f_2+\bar{f}_1\bar{f}_2) \quad (1)$$

The weighing part of the encoder comprises six synthesizing networks $SN_1$ to $SN_6$ each having two inputs $b_j$ $b'_j$ and two outputs $a_j$, $a'_j$ ($j$= 1 to 6). The outputs $a_j$ and $a'_j$ are paralleled and their parallel connection is connected to the input 0 and 0′ of the discriminator DSC, respectively. The inputs $b_1$, $b_2$, $b_6$ of the synthetizing networks $SN_1$, $SN_2$ $SN_6$ are connected in parallel and their parallel connection is connected to the output $f_1$ of the gated-input flip-flop $F_1$. The inputs $b_3$, $b_4$, $b_5$ of the networks $SN_{3,4,5}$ are connected to the outputs $f_3$, $f_4$, $f_5$ of the gated-input flip-flops $F_3$, $F_4$, $F_5$, respectively. The input $b'_1$ of the network $SN_1$ is connected to the output $c$ of the gating circuit G, whereas the inputs $b'_2$ to $b'_6$ are connected to the outputs $ep_1$ to $ep_5$, and $\overline{ep}'_2$ of the previously mentioned timing source (not shown), respectively.

Figure 4:
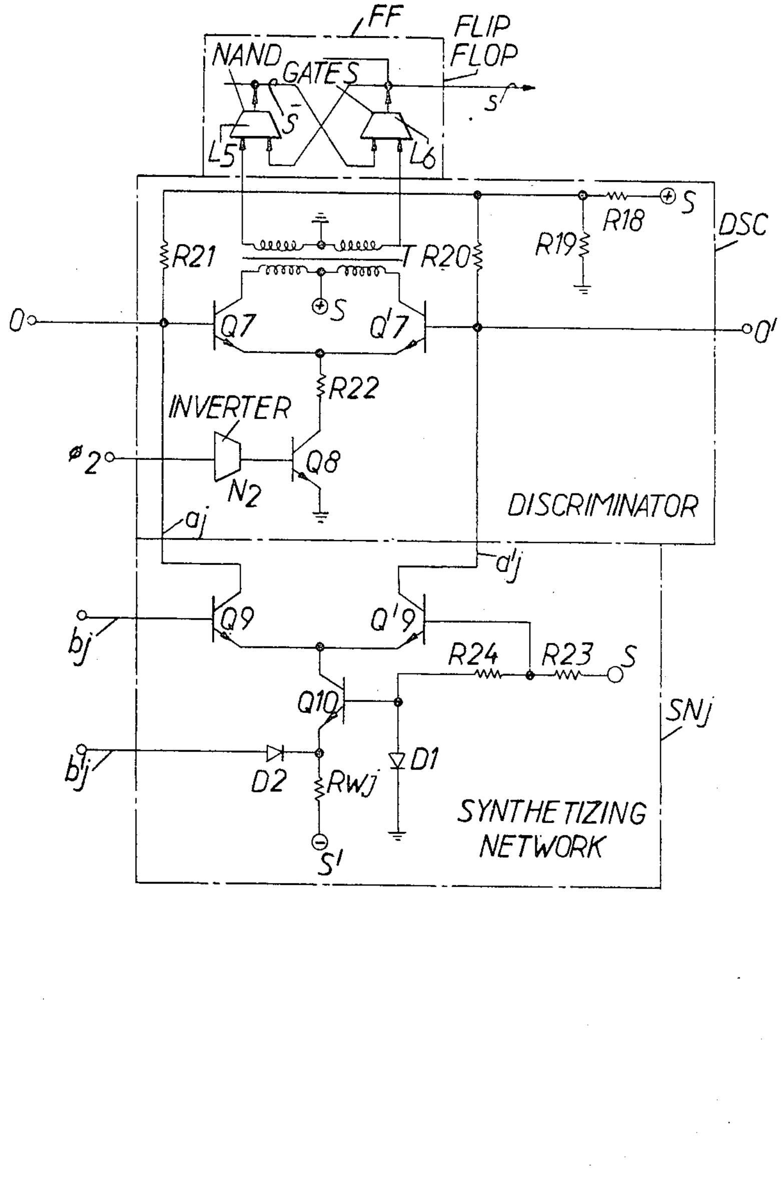
FIG. 4 shows in detail circuits of the encoder of FIG. 1.

FIG. 4 shows in detail the circuits of the discriminator DSC, the output flip-flop FF and the synthetizing network $SN_j$ ($j$=1 to 6).

The discriminator DSC comprises a pair of NPN transistors $Q_7$, $Q'_7$ mounted as a differential amplifier, a switching NPN transistor $Q_8$ and an output transformer T. The collector electrodes of the transistors $Q_7$ and $Q'_7$ are connected to each other through the primary winding of the transformer T which has a center-tapping connected to the positive terminal of a source S of DC fixed potential. The emitter electrodes of the transistors $Q_7$ and $Q'_7$ are connected to each other and further connected to the collector electrode of the transistor $Q_8$ through a resistor $R_{22}$, the emitter of the latter transistor $Q_8$ being connected to ground and its base electrode to the output $\emptyset_2$ of the previously mentioned source of clock pulses via an inverter $N_2$. The base electrodes of the transistors $Q_7$ and $Q'_7$ constituting the two inputs 0, 0′ between which the compressed PAM signals are applied to the discriminator, are, on the one hand, connected to the homologue outputs 0 and 0′ of the compressor C0 and, on the other hand, to the junction point of two potentiometer resistors $R_{18}$, $R_{19}$ through the identical resistors $R_{21}$ and $R_{20}$, respectively. The other ends of the potentiometer resistors $R_{18}$ and $R_{19}$ are connected to the positive terminal of the source S and to ground, respectively. The secondary winding of the transformer T is also provided with a center-tapping which is connected to ground. The flip-flop FF comprises two 2-input NAND gates $L_5$ and $L_6$, one input of these gates $L_5$ and $L_6$ being connected to the one and to the other end of the secondary winding of the transformer T respectively. The output $s$ of the gate $L_6$ constitutes the output of the encoder and is coupled to the transmission line (not shown). The synthetizing network $SN_j$ comprises a pair of NPN transistors $Q_9$ and $Q'_9$ which have their emitter electrodes connected to each other and further connected to the collector of a switching NPN transistor $Q_{10}$. The collector electrodes of the transistors $Q_9$ and $Q'_9$ constitute the outputs $a_j$ and $a'_j$ of the synthetizing network $SN_j$ and are connected to the base electrodes of the transistors $Q_7$ and $Q'_7$ of the discriminator DSC, respectively. The base electrode of the transistor $Q'_9$ is connected to the junction point of two potentiometer resistors $R_{23}$ and $R_{24}$. The other end of the resistor $R_{23}$ is connected to the positive terminal of the source S, whereas the other end of the resistor $R_{24}$ is connected, on the one hand, to the base electrode of the transistor $Q_{10}$ and on the other hand, to the anode electrode of a diode $D_1$ of which the cathode electrode is connected to ground. The emitter electrode of the transistor $Q_{10}$ is connected, on the one hand, to the negative terminal of a reference source S' of DC fixed potential through a weighing resistor $R_{Wj}$ and, on the other hand, to the cathode of a diode $D_2$. The base electrode of the transistor $Q_9$ and the anode electrode of the diode $D_2$ constitute the inputs $b_j$ and $b'_j$ of the synthetizing network $SN_j$ respectively.

Figure 5:
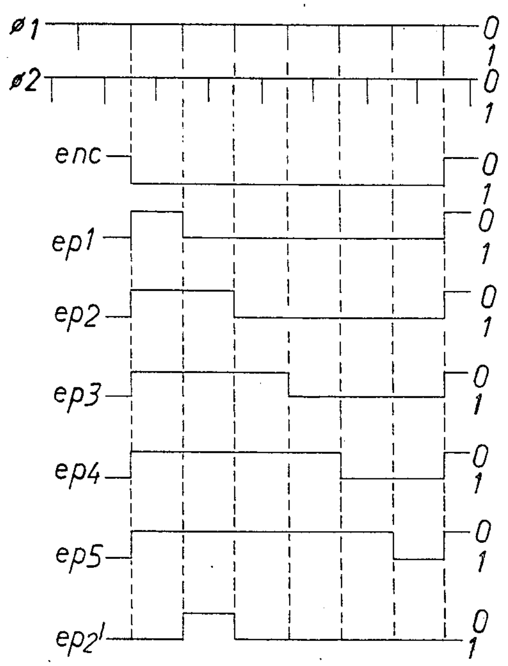
FIG. 5 represents timing pulse patterns applied to the encoder of FIGS. 1 and 4.

FIG. 5 shows the clock pulses $\emptyset_1$ and $\emptyset_2$ provided at the corresponding two outputs of a double phase clock (not shown) which constitutes the previously mentioned source of clock pulses, as well as, the pulse patterns $ep_1$ to $ep_5$ and $ep'_2$ applied to the circuits of FIG. 1. The $\emptyset_2$ clock pulses occur midway in the interval between two successive $\emptyset_1$ clock pulses, the time interval between two successive $\emptyset_1$ or $\emptyset_2$ clock pulses being equal to the length of a digit of the 6-digit PCM code. The pulse patterns $ep_1$ to $ep_5$ and $ep'_2$ are time positioned with respect to an encoding interval represented by the 1-condition of an encoding pattern *enc*.

It is to be noted that the negative logic convention is adopted throughout the present description and the logical levels 1 and 0 of the ON-OFF binary signals represent a ground and a positive, e.g., +6 v., DC potential, respectively. The encoding interval given by the logical 1-level of the pattern *enc* is allocated to the translation of a PAM signal into a 6-digit PCM code. This encoding interval may be divided into six consecutive digit encoding intervals by the $\emptyset_1$ clock pulses (dotted verticals of FIG. 5). It is seen that the pattern $ep_1$ assumes the 0-level only during the first digit encoding interval, the pattern $ep_2$ only during the first and second digit encoding intervals and so on for the patterns $ep_3$, $ep_4$, $ep_5$. These patterns $ep_1$ to $ep_5$ may be obtained from five corresponding outputs of a five stage ring counter (not shown) controlled by the $\emptyset_1$ clock pulses, the five stages of this counter assuming the six positions represented in FIG. 5 during the six consecutive digit encoding intervals. The pulse pattern $ep'_2$ is obtained by combining the patterns $ep_1$ and $ep_2$ ($ep'_2 = ep_1 \cdot \overline{ep}_2$) and its complement $\overline{ep}'_2$ by inverting the pattern $ep'_2$. It is also possible to obtain the above patterns $ep_1$ to $ep_5$ and $ep'_2$ by applying the principles of the U.S. copending application, Ser. No. 542,969, filed Apr. 15, 1966.

Figure 2:
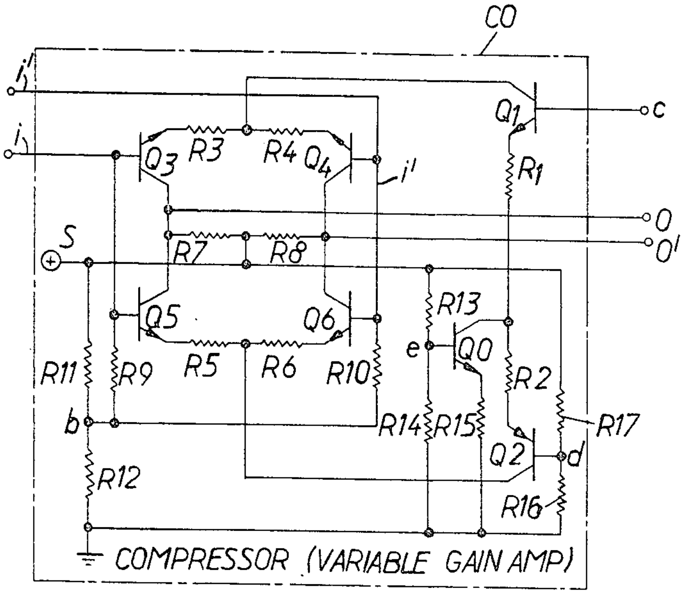
FIG. 2 shows a variable gain amplifier constituting the compressor circuit of the companded coder of FIG. 1.

Referring to FIG. 2, the compressor circuit shown therein is constituted by two main parts: an analog part and a control part. The analog part comprises two pairs of NPN transistors $Q_3$, $Q_4$ and $Q_5$, $Q_6$ mounted as two differential amplifiers, which are connected in parallel to each other. The control part comprises the switching NPN transistors $Q_1$, $Q_2$ and the NPN transistor $Q_0$, which is mounted as a constant current generator. The emitters of the transistors $Q_3$ and $Q_4$ are connected to each other via the series connection of two identical resistors $R_3$ and $R_4$, the junction point of which is connected to the collector of the switching transistor $Q_1$. In a similar way the emitters of the transistors $Q_5$ and $Q_6$ are connected to each other through the series connection of two identical resistors $R_5$ and $R_6$, the junction point of which is connected to the collector of the switching transistor $Q_2$. The collectors of the transistors $Q_3$ and $Q_4$ are connected to the collectors of the transistors $Q_5$ and $Q_6$ respectively and the junction points of these collectors are connected to each other through the series connection of two identical output resistors $R_7$ and $R_8$, the junction point of which is connected to the positive terminal of the source S of DC fixed potential. The base electrodes of the transistors $Q_3$ and $Q_5$, as well as, of the transistors $Q_4$ and $Q_6$ are connected to each other and further connected to the junction point of two series connected resistors $R_{11}$ and $R_{12}$ through the identical resistors $R_9$ and $R_{10}$, respectively. The other ends of the resistors $R_{11}$ and $R_{12}$ are connected to the positive terminal of the source S and to ground, respectively. The interconnected base electrodes of the transistors $Q_3$ and $Q_5$ constitute the input terminal *i* of the compressor, whereas the interconnected base electrodes of the transistors $Q_4$ and $Q_6$ may constitute a second input terminal *i'* of the compressor. The interconnected collector electrodes of the transistors $Q_3$ and $Q_5$ and of the transistors $Q_4$ and $Q_6$ constitute the output terminals 0 and 0' of the compressor C0, respectively. The emitter electrodes of the switching transistors $Q_1$ and $Q_2$ are connected to each other through the series connection of the resistors $R_1$ and $R_2$, the junction point of which is connected to the collector of the transistor $Q_0$. The base electrode of the transistor $Q_1$ is connected to the output *c* of the gating circuit G of the encoder, whereas the base electrode of the transistor $Q_2$ is connected, on the one hand, to the positive terminal of the source S via a resistor $R_{17}$ and, on the other hand, to ground via a resistor $R_{16}$. The base electrode of the transistor $Q_0$ is connected to the positive terminal of the source S and to ground via the resistors $R_{13}$ and $R_{14}$, respectively. The emitter electrode of the transistor $Q_0$ is connected to ground through a resistor $R_{15}$.

In the fully-balanced mode of operation, the PAM signals to be compressed are applied between the input terminals *i*, *i'* of the compressor C0 through a symmetrical transformer (not shown), which performs the balancing of the input PAM signals, whereas the compressed balanced output signals are taken between the output terminals 0 and 0' of the compressor C0.

A more advantageous mode of operation which becomes possible with this type of compressor C0 is the semi-balanced mode here adopted, i.e., unbalanced input and balanced output. The unbalanced input PAM signals are applied to the input terminal *i* and the balanced output signals are taken between the output terminals 0 and 0' of the compressor C0. In this way the use of the above input transformer is avoided.

It is equally possible to adopt a fully-unbalanced operation mode for this compressor C0 without losing in the quality of the compressed output PAM signals as will be explained later, but only half of the amplitude with respect to the output signals of the above full- or semi-balanced mode of operation. In the latter fully-unbalanced mode of operation, the input PAM signals to the compressor C0 are applied to one input terminal *i* or *i'* and the output signals are taken from one output terminal 0 or 0'.

Figure 3:
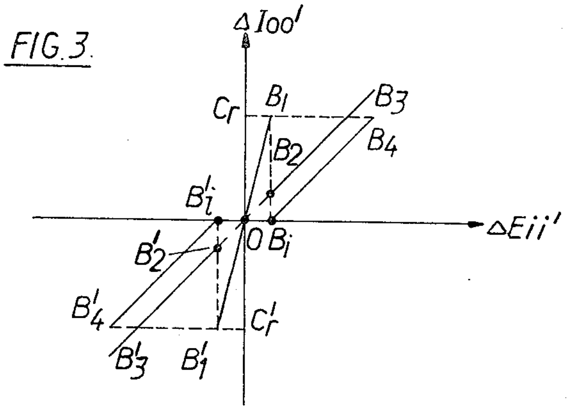
FIG. 3 represents the input-output characteristic of the variable gain amplifier, or compressor circuit of FIG. 2.

The input-output characteristic of the compressor C0 (FIGS. 1, 2) is shown in the diagram of FIG. 3, wherein the input voltages $\Delta E_{ii'}$ and the output currents $\Delta I_{00'}$ are reported on the homologue orthogonal axes;

$$\Delta E_{ii'} = E_i - E_{i'} \text{ and } \Delta I_{00'} = I_0 - I_{0'}$$

$E_i$ being the voltage of the input terminal *i*,
$E_{i'}$ the voltage of the lead *i*,
$I_0$ the current in the output terminal 0,
$I_{0'}$ the current in the output terminal 0'.

The output currents $OC_r$ and $OC'_r$ ($OC_r = -OC'_r$) on the axis $\Delta I_{00}$ correspond to the quantum levels 48 and 16, or to the code numbers +16 and −16 of the PCM code, respectively. The input-output characteristic of the compressor C0 is composed of the straight line segments $B'_1B_1$, $B'_3B_2$, and $B_2B_3$. As it will be explained later, the segments $B'_3B'_2$ and $B_2B_3$ are vertically shifted to their parallel positions $B'_4B'_1$ and $B_1B_4$ by means of a current $B'_1B'_2$, or $B_1B_2$ applied to the input 0 or 0' of the discriminator DSC by means of the synthetizing network $SN_1$.

Hereinafter the principle of operation of the compressor C0 and of the encoder will be described, reference being made to FIGS. 1 to 6.

In the normal or high gain condition which corresponds to the line $B'_1B_1$ of the compression characteristic the differential amplifiers $Q_3$, $Q_4$ and $Q_5$, $Q_6$ are both active. This is performed by fixing the DC voltage at the base $e$ of the transistor $Q_0$ to a lower level than the DC voltage at the base $d$ of the switching transistor $Q_2$ and by fixing the control voltage $Vc$ at the control terminal $c$, e.g., equal to the DC voltage at the base $d$ of the transistor $Q_2$, e.g., +6 v. In this case the total emitter current of transistors $Q_3$ to $Q_6$ which is supplied by the constant current supply transistor $Q_0$ and which is symmetrically shared by the collector resistors $R_7$ and $R_8$ flows through both transistor pairs $Q_3$, $Q_4$ and $Q_5$, $Q_6$, and the amplification coefficient $G_{B'_1B_1}$ is approximately given by the relation:

$$G_{B'_1B_1}=\frac{R_7(R_3+R_5)}{R_3R_5}=\frac{R_8(R_4+R_6)}{R_4R_6} \quad (2)$$

where $$R_7=R_8>R_3=R_4<R_5=R_6 \quad (3)$$

A PAM signal applied to the input $i$ of the compressor is amplified with this amplification coefficient $G_{B_1'B_1}$ and supplied to the discriminator DSC through the output 00' of the compressor C0. The encoder then starts the sequential comparisons of the compressed PAM signal, which is applied to the discriminator inputs with reference signals.

During the first digit encoding interval the patterns $ep_1$ to $ep_5$ and $\overline{ep}'_2$ assume their logical 0-level which corresponds to a positive DC potential, e.g., +6 v. Hence, the emitter of the NPN transistor $Q_{10}$ in each synthetizing network $SN_j$ is at a more positive potential than the corresponding base electrode, e.g., emitter at +5.3 v. and base at +0.7 v. assuming the voltage drop across the diodes $D_1$ and $D_2$ equal to 0.7 v. Due to the emitter electrode of the NPN transistor $Q_{10}$ being at a more positive potential than the base electrode, this transistor $Q_{10}$ is in the blocking condition and the current path from the reference source S' to the collectors $a_j$ and $a'_j$ of the transistors $Q_9$ and $Q'_9$ is interrupted, i.e., there is no reference signal applied to the inputs 0, 0' of the discriminator DSC. The $\emptyset_1$ and $\emptyset_2$ outputs of the double phase clock normally are at the logical 0-level, i.e., positive, and are brought to the logical 1-level, i.e., ground, during the occurrence of a $\emptyset_1$ and $\emptyset_2$ phase clock pulse, respectively. The base electrode of the transistor $Q_8$ which is connected to the output $\emptyset_2$ of the above said double phase clock via the inverter $N_2$ is normally held at the ground potential and is brought at a positive potential, e.g., +6 v., during the occurrence of a $\Phi_2$ phase clock pulse. Hence, the transistor $Q_8$ is normally cut off and is conductive only during the occurrence of a $\Phi_2$ phase clock pulse. Consequently, the discriminator DSC is effective only during the occurrence of a $\Phi_2$ phase clock pulse, i.e., the decision instants take place with the occurrence of $\Phi_2$ phase clock pulses. During the above mentioned first digit encoding interval and at the moment of occurrence of a $\Phi_2$ phase clock pulse the discriminator DSC is fired and performs the first decision which relates to the polarity of the compressed PAM input signal. This decision is registered by the flip-flop FF and is sent to the transmission line (not shown). For a positive PAM input signal, the current in the input terminal 0 of the discriminator DSC is larger than that in the input terminal 0', the reverse taking place for a negative input PAM signal. Assuming the output $s$ of the flip-flop FF being brought to the logical 1-level and to the logical 0-level during the first decision of the encoding process of a positive and of a negative PAM input signal, respectively, it is seen that a PCM code corresponding to a positive and to a negative PAM signal has as first or most weighted digit a 1- and a 0-digit, respectively. It is now assumed that the above said first decision has caused a 1-level output digit to appear at the output terminal $s$ of the flip-flop FF, i.e., the input PAM signal is positive. The gated-input flip-flops $F_1$ to $F_5$ which are coupled to the outputs $s$ and $\bar{s}$ of the flip-flop FF and which are all enabled during the first digit encoding interval ($ep_1$ to $ep_5$ at the 0-level), memorize the result of this first decision. The output 1-level signal at the terminal $s$ causes the output $f_i(i=1$ to $5)$ of each gated-input flip-flop $F_1$ to $F_5$ to be brought to the 1-level, i.e., to the ground potential. From the end of the first bit encoding interval, the gated-input flip-flop $F_1$ is inhibited, since the pattern $ep_1$ applied to its input 2 then assumes the 1-level, i.e., the ground potential, and consequently, it keeps its registration up to the end of the sixth digit encoding interval. During the second digit encoding interval, the transistor $Q_{10}$ of the synthetizing networks $SN_2$ and $SN_6$ is brought to the conductive condition due to the patterns $ep_1$ and $\overline{ep}'_2$ being then at the 1-level and the current path is established from the source S' to the transistors $Q_9$ and $Q'_9$ of these networks $SN_2$ and $SN_6$ through the corresponding weighing resistors $RW_2$ and $RW_6$. The base of the transistors $Q_9$ being at the 1-level, i.e., at the ground potential, by means of the corresponding $fi$ outputs of $F_1$ to $F_5$ and the base of the transistors $Q'_9$ being biased at a positive potential, e.g., +4 v., the reference or constant currents given by the enabled networks $SN_2$ and $SN_6$ flow from the source S' through the weighing resistors $RW_2$ and $RW_6$ and the collectors $a'_2$ and $a'_6$ of the corresponding transistors $Q'_9$ and are summed at the input 0', of the discriminator DSC, i.e., at the base of the transistor $Q'_7$. The transistors $Q_9$ of the networks $SN_2$ and $SN_6$ are blocked due to their base electrode being at a more negative potential (ground) than the base electrodes of the transistors $Q'_9$ (+4 v.). The networks $SN_2$ and $SN_6$ of which the weighing resistors $RW_2$ and $RW_6$ are identical, give each a reference constant current $I/2$, and their sum I which is equal to $OC_r$ (FIG. 3) is applied to the input 0' of the discriminator DSC. Thus, the second decision, which takes place in the same manner as the previously described first decision, relates to the current level $C_r$, i.e., the compressed PAM signal above or below this level $C_r$. It is now assumed that the second decision causes a 1-digit to appear again at the output $s$ of the flip-flop FF, i.e., the output $s$ remains in the same condition it has taken at the first decision, this meaning that the PAM input signal is at a higher level than the level $C_r$. The gated-input flip-flops $F_2$ to $F_5$, which are still enabled, register the above second digit, i.e., they remain in the same condition, and the gated-input flip-flop $F_2$ is inhibited from the end of the second digit encoding interval up to the end of the sixth digit encoding interval. The output of the gating circuit G which forms the logical combination $c=ep_2(\bar{f}_1\bar{f}_2+f_1f_2)$ is brought to the logical 1-level at the end of the second digit encoding interval. Thus, the switching transistor $Q_1$ of the compressor C0 is cut-off and the same is true for the transistor pair $Q_3$, $Q_4$ of this compressor. However, the switching transistor $Q_2$ remains in the conductive condition, hence, the transistor pair $Q_5$, $Q_6$, too, and the amplification coefficient is now determined by this pair of transistors $Q_5$, $Q_6$. This amplification coefficient $G_{B'_3B_3}$ is given by the following relation:

$$G_{B'_3B_3}=\frac{R_7}{R_5}=\frac{R_8}{R_6} \quad (4)$$

and the ratio between both coefficients $G_{B'_1B_1}$ and $G_{B'_3B_3}$ by the relation:

$$\frac{G_{B'_1B_1}}{G_{B'_3B_3}}=\frac{R_3+R_5}{R_3}=\frac{R_4+R_6}{R_4} \quad (5)$$

Assuming that $R_7=R_8=R_5=R_6$, the coefficient $G_{B'_3B_3}$ is equal to unity. It is obvious that any values may be chosen for the coefficients $G_{B'_1B_1}$ and $G_{B'_3B_3}$ by properly choosing the values of the resistors $R_3$ to $R_8$.

An alternative mode of operation of the compressor C0 is to make only the transistors $Q_3$, $Q_4$ active at the high gain condition $B'_1B_1$ and the transistors $Q_5$, $Q_6$ active at the low gain condition $B'_3B_3$. This may easily be done by adequately choosing the fixed voltages of the bases *e* and *d* of the transistors $Q_0$ and $Q_2$ respectively and the control voltage V*c*. The amplification coefficients $G_{B'_1B_1}$ and $G_{B'_3B_3}$ for this mode of operation are as follows:

$$G_{B'_1B_1}=\frac{R_7}{R_3}=\frac{R_8}{R_4} \quad (6)$$

$$G_{B'_3B_3}=\frac{R_7}{R_5}=\frac{R_8}{R_6} \quad (7)$$

and the ratio between both coefficients:

$$\frac{G_{B'_1B_1}}{G_{B'_3B_3}}=\frac{R_5}{R_3}=\frac{R_6}{R_4} \quad (8)$$

The latter alternative mode of operation, however, presents a slight drawback with respect to the first mode of operation. Indeed, when the available constant current, supplied by the transistor $Q_0$, is switched from one transistor pair $Q_3$, $Q_4$ to the other $Q_5$, $Q_6$, a short transition period during which the current is shared between the two transistor pairs $Q_3$, $Q_4$ and $Q_5$, $Q_6$ cannot be avoided. During this period the amplification coefficient is determined by the relation (2) and it is different from the final amplification coefficient which is given by the relation (7). It is, therefore advantageous to realize the high gain condition by sharing the above said available current between the two pairs of transistors $Q_3$, $Q_4$ and $Q_5$, $Q_6$.

The previous formulae and remarks are valid for the balanced and unbalanced modes of operation of the circuit.

For all these modes of operation, the decoupling between control and transmission path is almost perfect because the direct current through $R_7$ and $R_8$ does not depend on the control voltage V*c*. It is kept constant by the constant current generator $Q_0$. It is to be noted that in the absence of the constant current generator $Q_0$, an interaction between the control voltage V*c* and the output current $\Delta I_{00}'$ could not be avoided owing to the relative importance of the output current to be switched. For such a case, even if the reading or decision instants in the encoder are delayed with respect to the switching instants, as in the present case, transient effects will still be present and they will lead to a disturbance of the output signals of the compressor C0.

The synthetizing network $SN_1$ is enabled at the end of the previously mentioned second digit encoding interval and the constant current *I*/*k* which flows through the weighing resistor $RW_1$ and which is equal to the current $B_1B_2$ (FIG. 3) is applied to the terminal 0′ so that, one may say that the line $B_2B_3$ of the compression characteristic is shifted to the parallel position $B_1B_4$. The segment $B_1B_4$ corresponds to the code numbers +16 to +32. Actually, it is the axis $\Delta E_{ii}'$, which is shifted parallely to itself by the amount $B_1B_2$, but it is easier to assume that the segment $B_2B_3$ is shifted to $B_1B_4$ and to disregard in the following steps the effect of the network $SN_1$. During the third digit encoding interval, the input PAM signal to the discriminator DSC which is now amplified according to the line $B_1B_4$ is compared to the reference current level $C_r/2=I/2$ applied to the input 0′ of the discriminator DSC by the synthetizing network $SN_2$. Assuming that the third decision results in a 0-digit, or 0-level output PCM signal appearing on the output *s* of the flip-flop FF, i.e., the level of the PAM signal compressed according to $B_1B_4$ is lower than the reference level $C_r/2$, the respective outputs $f_3$, $f_4$, $f_5$ of the gated-input flip-flops $F_3$, $F_4$, $F_5$ are brought to the logical 0-level, e.g., +6 v., and the gated-input flip-flop $F_3$ is inhibited from the end of the third digit encoding interval up to the end of the sixth digit encoding interval. The synthetizing network $SN_3$ which gives a reference constant current *I*/4 is enabled from the moment the third digit encoding interval ends. This reference current *I*/4 now flows through the collector $a_3$ since the base of the transistor $Q'_9$ of the synthetizing network $SN_3$ is less positive, i.e., +4 v., than the base of the corresponding transistor $Q_9$, e.g., +6 v. It can be said that the latter reference current $I/4=C_r/4$ applied to the input 0 of the discriminator DSC is subtracted from the reference current *I*/2 supplied by the network $SN_2$ and the fourth decision relates to the comparison of the compressed PAM input signal to the reference current level $C_r/4$. The encoding process is continued in the same way by successively making active the synthetizing networks $SN_4$ and $SN_5$ which give a reference currents *I*/8 and *I*/16, respectively.

If the previously mentioned second decision had caused a 0-digit to appear on the output *s* of the flip-flop FF, this means that the level of the input PAM signal to the discriminator DSC is lower than the reference level $C_r$, the output *c* of the gating circuit G would have continued to assume the logical 0-level, e.g., +6 v., resulting in the non-activation of the network $SN_1$ and to the continuance of the encoding process with the PAM signal amplified according to the line $0B_1$ of the compression characteristic. From the above, it is seen that a compressed positive PAM signal corresponds to a PCM code number beyond or below the code number +16 according to the two most weighted binary digits of the PCM code being 11 or 10, respectively. In the same way, a compressed negative PAM signal corresponds to a PCM code number beyond or below the code number −16 according to the two most weighted binary digits of the code being 00 or 01, respectively. Summarizing, a PAM signal amplified according to the line $B'_1B_1$ and situated in the zone between the current levels $C_r$ and $C'_r$, or outside this zone, corresponds to a code number in the PCM code number-zone +16 and −16, or outside this zone according to the two most weighted binary digits of the PCM code being different, or identical to each other, respectively. The identity or not of the above said two most weighted digits of the PCM code is detected by the gating circuit G and the gain of the compressor C0 is switched to the lower gain condition from the end of the second digit encoding interval if this identity occurs.

FIG. 8 shows in block diagram an expandor circuit EX similar to the circuit of FIG. 2, but having a complementary characteristic to that shown in FIG. 3, so that the whole compressor-expandor characteristic is linear. The principle of operation of the expandor circuit EX can now readily be understood. The decoder DEC receives the 6-digits of the previous mentioned PCM code in series form, stores them in its memory (not shown) and performs their conversion in parallel form. Then it delivers a corresponding analog signal to the expandor circuit EX, which has previously been switched to the required gain condition by a control voltage V*c* applied to the control terminal *c* in a similar manner to that described in connection with the compressor C0, e.g., as soon as the decoder DEC has received the second digit of the 6-digit PCM code.

It is to be noted that the word "gain" is herein used with a broad meaning and that a gain condition may be an attenuation condition.

Referring to FIG. 9, there is shown part of a phase inverter modulator circuit which may provide a negative and a positive gain, e.g., +1 and −1. This modulator circuit which does not make use of transformers is similar to the circuit of FIG. 2, only the connections between the transistor pair $Q_3$, $Q_4$ and the output resistors $R_7$, $R_8$ being reversed. The carrier or control signal is applied to the control terminal *c′*. The above circuit which may have many applications, e.g., in carrier telegraphy, can also advantageously be used with decoders which have no pedestal voltage, e.g., providing only positive analog signals. The gain coefficient, in the case of both pairs of transistors $Q_3$, $Q_4$ and $Q_5$, $Q_6$ being active (negative gain condition), is given by the relation:

$$G_1=\frac{(R_3-R_5)R_7}{R_3R_5}=\frac{(R_4-R_6)R_8}{R_4R_6} \qquad (9)$$

with $R_3=R_4<R_5=R_6$ and in the case of only the transistor pair $Q_5$, $Q_6$ being active, by the relation (7). These coefficients may, for instance, assume the values: $G_1=-1$ and $G_{B'_3B_3}=+1$ if $R_5=R_7=2R_3$. It is obvious that the first or most weighted PCM code digit is sufficient for making the setting of this circuit in the negative or positive gain condition, since a PCM code corresponding to a positive or a negative analog signal has as most weighted digit a 1- or 0-digit, respectively. The setting of this circuit in the positive or negative gain condition may be performed in a similar way to the previous described one in connection with the compressor C0. Indeed, as it has previously been mentioned, the decoder DEC includes a memory (not shown) wherein the successively received PCM digits are stored and after the last digit, the sixth, being received the complete PCM code signal stored in the memory is translated to an analog signal which is applied to the expander. The above memory may, for instance, be constituted by six flip-flops. It is then sufficient to take one output of the flip-flop which memorizes the most weighted digit of the PCM code as the control terminal $c'$ and to perform the setting of the circuit of FIG. 9 to the involved gain condition.

FIG. 10 shows a complete expander circuit adapted to be used with decoders which have no pedestal voltage. It comprises two stages $EX_1$ and $EX_2$ in series connection with each other and with the decoder DEC. The first stage $EX_1$ is similar to the demodulator circuit of FIG. 9 and the second stage $EX_2$ to the circuit EX of FIG. 8. The setting of the stage $EX_1$ to the negative or positive gain condition is performed through the control terminal $c'$ in the manner described hereabove and the setting of the stage $EX_2$ through the control terminal $c$ in the same manner described in connection with the circuit of FIG. 8.

In the above description of the compressor and expander circuits, it has been assumed that the compression or expansion characteristic was constituted by two straight line portions or gain conditions. This has been made only for simplification purposes and it is now obvious that these compressor and expander circuits may easily be adapted to provide a characteristic which is constituted by a larger number of gain conditions, e.g., by connecting in parallel more than two pairs of transistors $Q_3$, $Q_4$ and $Q_5$, $Q_6$ (FIG. 2) and eventually by providing more than one control terminal $c$. It is also obvious that in the latter case of more than two gain conditions, the third and eventually a number of the successive other PCM code digits may be used for detecting the zones of different gain conditions, and the gating circuit G of FIG. 6 should comprise more elements.

What is claimed is:

1. A variable gain amplifier comprising:
at least a first and a second amplifying section;
said first section having at least a first input and at least a first output;
said second section having at least a first input directly connected to said first input of said first section and at least a first output directly connected to said first output of said first section;
a common output impedance coupled to said first output of both of said sections;
a constant current generating means;
switching means disposed between both of said sections and said generating means to controllably couple said generating means to said sections; and
control means coupled to said switching means to control the coupling of said generating means to said sections;
said switching means being coupled to a predetermined point of both said sections to provide substantially perfect decoupling between the control of said sections and the useful signal path through said sections to said output impedance.

2. An amplifier according to claim 1, wherein
said switching means and said control means cooperate to control the electrical connection of said generating means to said predetermined point of said sections to establish at least two distinct linear input-output relationships having slopes of the same sign for said amplifier.

3. An amplifier according to claim 1, wherein
each of said sections includes
a first output, and
a second output;
said first output of said first section is directly connected to said first output of said second section;
said second output of said first section is directly connetced to said second output of said second section; and
said common output impedance includes
a first impedance having a first terminal coupled to said first outputs of said sections and a second terminal, and
a second impedance having a first terminal coupled to said second terminal of said first impedance and a second terminal coupled to said second outputs of said sections; and
further including
an amplifier input terminal coupled in common to said first input of both said sections;
a source of fixed direct current potential coupled to said second terminal of said first impedance and said first terminal of said second impedance; and
at least one amplifier output terminal coupled to one of said first terminal of said first impedance and said second terminal of said second impedance.

4. A phase-inverter modulator comprising a variable gain amplifier according to claim 1, wherein
said switching means and said control means cooperate to control the electrical connection of said generating means to said predetermined point of said sections to provide a linear input-output relationship having a slope selected from a first slope of given sign representing a positive gain condition and a second slope with a sign opposite said given sign representing a negative gain condition.

5. A phase-inverter modulator including a variable gain amplifier according to claim 1, wherein
said first section includes
a first output, and
a second output;
said second section includes
a first output symmetrically disposed with respect to said first output of said first section, and
a second output symmetrically disposed with respect to said second output of said first section;
said first output of said first section is directly connected to said second output of said second section;
said second output of said first section is directly connected to said first output of said second section; and
said common output impedance includes
a first impedance having a first terminal coupled to said second output of said first section and said first output of said second section and a second terminal, and
a second impedance having a first terminal coupled to said second terminal of said first impedance and a second terminal coupled to said first output of said first section and said second output of said second section; and further including an amplifier input terminal coupled in common to said first input of both said sections;

a source of fixed direct current potential coupled to said second terminal of said first impedance and said first terminal of said second impedance; and at least one amplifier output terminal coupled to one of said first terminal of said first impedance and said second terminal of said second impedance.

6. A modulator according to claim 5, wherein each of said sections includes a first input, and a second input; and further including a first amplifier input terminal coupled in common to said first input of both of said sections;

a second amplifier input terminal coupled in common to said second input of both of said sections;

means to couple a first input signal of given amplitude and phase to said first input terminal; and means to couple a second input signal having a phase opposite said given phase and an amplitude equal to said given amplitude to said second input.

7. A modulator according to claim 5, wherein each of said sections are differential amplifiers.

8. A modulator according to claim 5, wherein said first section includes a first transistor having a base, an emitter and a collector, and a second transistor having a base, an emitter and a collector;

said second section includes a third transistor having a base, an emitter and a collector symmetrically disposed with respect to said first transistor, and a fourth transistor having a base, an emitter and a collector symmetrically disposed with respect to said second transistor;

said base of both said first and third transistors are directly connected together;

said base of both said second and fourth transistors are directly connected together;

said collector of both said first and fourth transistors are directly connected together;

said collector of both said second and third transistors are directly connected together;

first means is coupled to said emitter of both said first and second transistors and said switching means;

second means is coupled to said emitter of both said third and fourth transistors and said switching means;

said first terminal of said first impedance is coupled to said collector of both said first and fourth transistors; and said second terminal of said second impedance is coupled to said collector of both said second and third transistors.

9. An amplifier according to claim 1, wherein each of said sections are differential amplifiers.

10. An amplifier according to claim 1, wherein said first section includes a first transistor having a base, an emitter and a collector, and a second transistor having a base, an emitter and a collector;

said second section includes a third transistor having a base, an emitter and a collector, and a fourth transistor having a base, an emitter and a collector;

said base of both of said first and third transistors are directly connected together;

said base of both said second and fourth transistors are directly connected together;

said collector of both said first and third transistors are directly connected together;

said collector of both said second and fourth transistors are directly connected together;

first means is coupled to said emitter of both said first and second transistors and said switching means;

second means is coupled to said emitter of both said third and fourth transistors and said switching means; and said common output impedance is coupled between said collectors of said first and third transistors and said collectors of said second and fourth transistors; and further including an amplifier input terminal coupled to at least one of said bases of said first and third transistors and said bases of third and fourth transistors; and an amplifier output terminal coupled to at least one of said collectors of said first and third transistors and said collectors of said second and fourth transistors.

References Cited

UNITED STATES PATENTS

| | | | |
|---|---|---|---|
| 3,168,709 | 2/1965 | Sikorra | 330—30 |
| 3,381,142 | 4/1968 | Cook | 330—30 X |

NATHAN KAUFMAN, Primary Examiner

U.S. Cl. X.R.

330—69; 332—16